(12) United States Patent
Marko et al.

(10) Patent No.: US 8,971,123 B2
(45) Date of Patent: Mar. 3, 2015

(54) MEMORY SYSTEM TEMPERATURE CALIBRATION

(75) Inventors: Gilad Marko, Be'er Sheba (IL); Shai Tubul, Be'er Sheba (IL); Alex Mostovoy, Be'er Sheba (IL)

(73) Assignee: SanDisk IL Ltd, Kfar Saba (IL)

( * ) Notice: Subject to any disclaimer, the term of this patent is extended or adjusted under 35 U.S.C. 154(b) by 400 days.

(21) Appl. No.: 13/350,275

(22) Filed: Jan. 13, 2012

(65) Prior Publication Data
US 2013/0182507 A1 Jul. 18, 2013

(51) Int. Cl.
*G11C 16/06* (2006.01)
*G11C 16/26* (2006.01)
*G11C 11/06* (2006.01)
*G11C 11/406* (2006.01)

(52) U.S. Cl.
CPC .......... *G11C 16/26* (2013.01); *G11C 11/40626* (2013.01); *G11C 11/06007* (2013.01)
USPC ................. 365/185.21; 365/189.09; 365/211; 365/212; 365/222

(58) Field of Classification Search
CPC ............. G11C 16/26; G11C 11/06007; G11C 11/40626
USPC ................. 365/185.21, 189.09, 211, 212, 222
See application file for complete search history.

(56) References Cited

U.S. PATENT DOCUMENTS

| | | | |
|---|---|---|---|
| 7,436,724 B2 | 10/2008 | Nandi | |
| 7,889,575 B2 | 2/2011 | Wang et al. | |
| 7,896,545 B2 | 3/2011 | Pan | |
| 2008/0267258 A1* | 10/2008 | Hokenmaier | 374/166 |
| 2010/0292949 A1 | 11/2010 | Van Rijnswou | |
| 2011/0019713 A1 | 1/2011 | Sinha et al. | |
| 2011/0150029 A1* | 6/2011 | Pan | 374/1 |
| 2011/0219203 A1* | 9/2011 | Nurminen et al. | 711/165 |
| 2012/0224425 A1* | 9/2012 | Fai et al. | 365/185.09 |

* cited by examiner

*Primary Examiner* — Toan Le
(74) *Attorney, Agent, or Firm* — Davis Wright Tremaine LLP

(57) ABSTRACT

A nonvolatile memory system includes a memory controller chip with at least one temperature sensor that is individually calibrated, at a single temperature, after the nonvolatile memory system is assembled, so that the calibration data is stored outside the memory controller chip, in a nonvolatile memory chip, thus obviating the need for components to store calibration data in the memory controller chip.

16 Claims, 9 Drawing Sheets

MEMORY SYSTEM TEMPERATURE CALIBRATION

BACKGROUND

This application relates to the operation of nonvolatile memory systems such as semiconductor flash memory systems, and, more specifically, to systems and methods of calibrating temperature sensors in Application Specific Integrated Circuits (ASICs) that are used in such nonvolatile memory systems.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

A nonvolatile memory chip generally includes an array of nonvolatile memory cells along with circuits used to access those cells and various peripheral circuits that may be used to transfer data to and from the memory array. For example, data buffers, sense amplifiers, charge pumps, voltage regulators, and other circuits may be formed on a nonvolatile memory chip.

In addition to flash memory, other forms of nonvolatile memory may be used in nonvolatile memory systems. For example Ferroelectric RAM (FeRAM, or FRAM) uses a ferroelectric layer to record data bits by applying an electric field that orients the atoms in a particular area with an orientation that indicates whether a "1" or a "0" is stored. Magnetoresistive RAM (MRAM) uses magnetic storage elements to store data bits. Phase-Change memory (PCME, or PRAM) such as Ovonic Unified Memory (OUM) uses phase changes in certain materials to record data bits. Various other nonvolatile memories are also in use or proposed for use in nonvolatile memory systems.

When writing data to a nonvolatile memory, a host typically assigns unique logical addresses to sectors, clusters or other units of data within a continuous virtual address space of the memory system. Like a disk operating system (DOS), the host writes data to, and reads data from, addresses within the logical address space of the memory system. A memory controller is typically provided within the memory system to translate logical addresses received from the host into physical addresses within the memory array, where the data are actually stored, and then keeps track of these address translations. The memory controller may also perform a variety of other functions related to managing the data stored in the nonvolatile memory and interfacing with the host.

A memory controller is typically formed on a memory controller chip that is separate from any memory chips. A memory controller chip may be an ASIC that is designed to perform the particular functions needed in a given memory system. These functions may include address translation as described above, error detection and correction using Error Correction Codes (ECC), communication with a host according to a particular communication protocol, performance of house-keeping operations such as garbage collection, wear-leveling between blocks in the nonvolatile memory, and other functions. While a memory controller chip is typically an ASIC, it can also be a general-purpose memory controller chip with some specific firmware, a Programmable Logic Device (PLD), or other chip. However, it is generally desirable for cost reasons to use an ASIC that is mass-produced at low cost per unit for large scale production.

A common nonvolatile memory system comprises one or more memory chips that are mounted on a printed circuit board, along with a memory controller chip, enclosed in a housing, and with a physical interface that allows it to be connected with a range of host devices. Examples of such standardized memory interfaces include: PCMCIA; SmartMedia; CompactFlash (CF); Memory Stick; SecureDigital (SD); miniSD; microSD and Universal Serial Bus (USB). The physical interface is generally accessible in a manner that allows electrical contacts in the physical interface of the memory system to contact corresponding electrical contacts in a host's physical interface when the memory system is connected to the host system (e.g. by inserting a memory card in an appropriate slot in a host system). Such nonvolatile memory systems are considered removable nonvolatile memory systems because they are easily connected to a host system, or disconnected from a host system. Host systems that are compatible with such removable memory systems include a range of consumer products such as Personal Computers (PCs); laptops; tablet computers; smartphones; cell-phones; digital cameras; video cameras; music players such as MP3 players; and voice recorders.

Another common nonvolatile memory system is an embedded nonvolatile memory system which is configured to be permanently connected to a host system. Embedded nonvolatile memory systems may include one or more nonvolatile memory chips and a memory controller chip in some form of chip packaging. However, embedded nonvolatile memory systems do not have a physical interface that is designed for quick connection to, and disconnection from, a host system. Instead, embedded nonvolatile memory systems have physical interfaces that are designed for permanent attachment. For example, an embedded memory system may consist of a memory chip, and a controller chip, enclosed together in a ceramic package that can be connected to a host system through a Ball Grid Array (BGA) or similar Surface Mount Technology (SMT). An embedded memory system may be attached to a Printed Circuit Board (PCB) of a host system using SMT, or may be permanently attached to a host system in some other manner. In general, once such an embedded memory system is interfaced with a particular host it cannot be removed without damaging the memory system and/or the host system. In many electronic products, especially mobile products such as cell phones, tablet computers, and music players, solid-state nonvolatile memory may form the primary data storage medium in place of a hard-disk drive. Such memory is often referred to as a solid-state drive.

FIG. 1 shows an example of a prior art memory system which includes a flash memory chip, a memory controller chip, and a host interface, all enclosed in a housing that provides physical protection for the memory system. While the flash memory is shown as a single chip in FIG. 1, a nonvolatile memory may be made up of multiple nonvolatile memory chips that are all under the control of a memory controller. The host interface is typically a standardized interface and the outer dimensions of the housing are generally designed according to a form factor that is also standardized so that the memory system is physically compatible with a range of host systems. The memory controller performs many functions in this memory system. The exact functions may vary from one memory system to another. Additional dedicated chips may also be provided in a memory system, although for cost reasons it is generally desirable to have a single ASIC performing all required functions that are not performed in the nonvolatile memory chip, or chips.

Memory controller chips, like other integrated circuit chips, are designed using dimensions that shrink as technology develops. And the speed at which memory controllers operate generally increases as technology develops (i.e. clock speeds become faster). These factors tend to cause memory controllers to generate increasingly significant heat. If a memory controller chip becomes too hot, the chip may become damaged and may fail. Temperature sensing functionality has been included in a memory controller chip to attempt to detect when a chip becomes hot so that some action can be taken before the chip is damaged by heat.

FIG. 2 shows certain temperature-sensing related components of a prior art memory controller chip. The memory controller chip has two temperature sensors (TS) that are connected to a temperature reading circuit. The temperature reading circuit is also connected to a set of e-fuses. The temperature reading circuit receives an input from a temperature sensor and uses calibration data stored in the e-fuses to determine the actual temperature at the temperature sensor. This temperature can then be used to determine if the memory controller chip is becoming too hot. Calibration data stored in the e-fuses is generated and stored at a relatively early stage of manufacture when the memory controller die is still in a Silicon wafer. That is, the temperature calibration, and saving of calibration data is performed on a Silicon wafer having many memory controller dies before they are divided (diced up) into separate memory controller chips.

FIG. 3 shows an example of a Silicon wafer in which a large number of memory controller dies is formed. A typical present-day Silicon wafer has a diameter of 300 mm and may have thousands of individual dies (for example 12,000 memory controller dies). While in principle all dies are identically formed and therefore should have identical characteristics, in practice differences occur between dies resulting in different characteristics. Some dies may be faster, or slower, while some are completely defective. One characteristic that may vary from die to die, and from sensor to sensor even within a die, is the output of a temperature sensor at a given temperature.

FIG. 4 shows an example of the variation in measured temperature from a number of nominally identical temperature sensors that are at a uniform temperature. It can be seen that most sensors are within about ten degrees of the average (about 32 degrees) but there are significant numbers even outside this range. It has been found that distributions may extend as much as twenty degrees above and below the average. This clearly indicates the importance of performing temperature calibration so that the outputs of these temperature sensors can be used to provide an accurate temperature.

Typical prior art calibration of temperature sensors is performed by heating a Silicon wafer and measuring temperature sensor output at multiple temperatures. At least two temperatures are generally used (e.g. 25 and 90 degrees centigrade) so that a sensor's output over a range of temperature is obtained. Calibration data is then stored in the e-fuses so that it is available during operation of the memory controller. It will be understood that the memory controller is not functional at the time of this calibration because it is still part of a Silicon wafer and does not have power, or communication with any other component such as a memory chip or a host interface. While external probes may be used to provide power and communication to do some basic testing and to write e-fuses, the memory controller is generally not capable of performing its functions at this point. The memory controller may not even have its firmware loaded or available because the firmware may be provided later in a separate memory chip.

There are certain drawbacks to the calibration procedure described above. It requires that e-fuses or other similar data storage is present in the memory controller chip which may take up valuable space, require additional processing steps, and generally increase cost. It also requires some time to heat the Silicon wafer and to perform testing at the various temperatures used for calibration. And specialized equipment must be available to heat the wafer and maintain it at a given uniform temperature while performing the calibration.

SUMMARY

According to a general aspect of the present invention, a temperature calibration procedure is provided which does not require testing at multiple temperatures, and which achieves calibration that is accurate for a range of temperatures from a calibration procedure that is performed at only one temperature, for example, at room temperature. This allows temperature calibration to be performed after the memory system is assembled, when the memory system is functional, and when calibration data can be stored in a separate nonvolatile memory chip, thus obviating the requirement for e-fuses or similar data storage in the memory controller chip. Significant saving may be achieved because of the time saved by performing calibration only at room temperature after the memory system is packaged, a stage when calibration using multiple temperatures could be prohibitively expensive because of the equipment and time needed. Significant saving may also be achieved by avoiding forming any e-fuses in the memory controller chip because e-fuses can add significant cost due to the cost associated with particular e-fuse technology IP, integration with other components, integration of e-fuse fabrication and testing in the manufacturing process, the additional processing steps and use of space that result when forming e-fuses in a memory controller chip.

An example of a method of calibrating a temperature sensor in a memory controller chip, in a multi-chip memory system, includes: assembling the multi-chip memory system, including connecting the memory controller chip to at least one nonvolatile memory chip; subsequently, measuring an output of the temperature sensor at a first temperature and storing a result of the measuring in the nonvolatile memory chip; subsequently, measuring an output of the temperature sensor at a second temperature that is different to the first temperature; and calculating the second temperature from: (a) the output of the temperature sensor at the second temperature; (b) the stored result of the measuring at the first temperature; and (c) a generic characteristic of temperature sensors of a genus that includes the temperature sensor.

The multi-chip memory system may be embodied in a flash memory card, solid-state drive, or USB drive, or may be embodied in an embedded memory system. The nonvolatile memory chip may be a flash memory chip. The generic characteristic may be a slope of a straight-line relationship between temperature and sensor output. The slope may be obtained prior to the assembling of the multi-chip memory system. No temperature calibration may be performed for the temperature sensor prior to the assembling. The measuring the output of the temperature sensor at the first temperature and storing the result of the measuring may be performed in a factory prior to sale to an end user. The measuring the output of the temperature sensor at the first temperature may provide temperature calibration for the memory controller chip without any other measuring of the output of the temperature sensor at another temperature.

An example of a multi-chip nonvolatile memory system includes: a nonvolatile memory chip that contains a plurality of nonvolatile memory cells; a memory controller chip that is connected to the nonvolatile memory chip; a temperature sensor, in the memory controller chip, providing an output that is dependent on temperature; and a temperature reading circuit connected to the output of the temperature sensor, in the memory controller chip, the temperature reading circuit calculating a temperature measurement from the output of the temperature sensor according to an offset that is stored in the nonvolatile memory chip, the offset derived from the output of the temperature sensor at a calibration temperature during calibration of the multi-chip nonvolatile memory system, and from a generic characteristic of temperature sensors of a genus that includes the temperature sensor.

The memory controller chip may have no e-fuses. The multi-chip nonvolatile memory system may include a physical interface for connecting to a host system. The physical interface may be a USB interface, or memory card interface. The physical interface may be a Ball Grid Array (BGA) interface.

An example of a method of providing on-chip calibrated temperature measurement for a temperature sensor in a memory controller chip of a multi-chip flash memory system includes: obtaining a generic characteristic of temperature sensors of a genus that includes the temperature sensor; assembling the multi-chip flash memory system, including connecting the memory controller chip to a flash memory chip; subsequently, measuring an output of the temperature sensor at a first temperature and storing a result of the measuring in the flash memory chip; subsequently, measuring an output of the temperature sensor at a second temperature that is different to the first temperature; calculating the second temperature from: (a) the output of the temperature sensor at the second temperature; (b) the stored result of the measuring at the first temperature; and (c) the generic characteristic of temperature sensors of a genus that includes the temperature sensor; comparing the second temperature with a threshold temperature; and modifying the operation of the memory controller chip if the second temperature is greater than the threshold temperature.

The threshold temperature may be a temperature above which continued operation of the memory controller chip is likely to cause impairment of memory controller functions or damage to the memory controller chip, and the modifying the operation of the memory controller chip may include modification that reduces heat generation in the memory controller chip.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
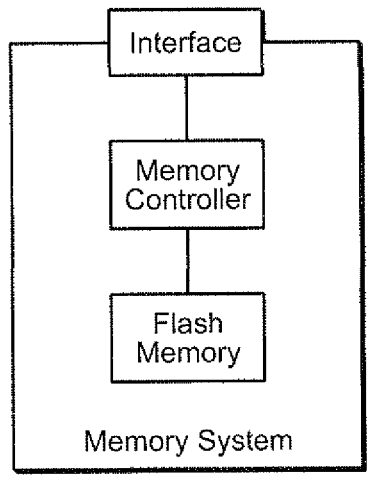
FIG. 1 illustrates a nonvolatile memory system according to the prior art.
Figure 2:
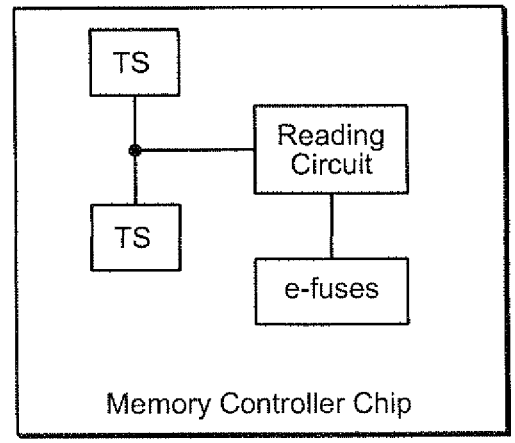
FIG. 2 illustrates certain temperature sensing circuits of a prior art memory controller chip.
Figure 3:
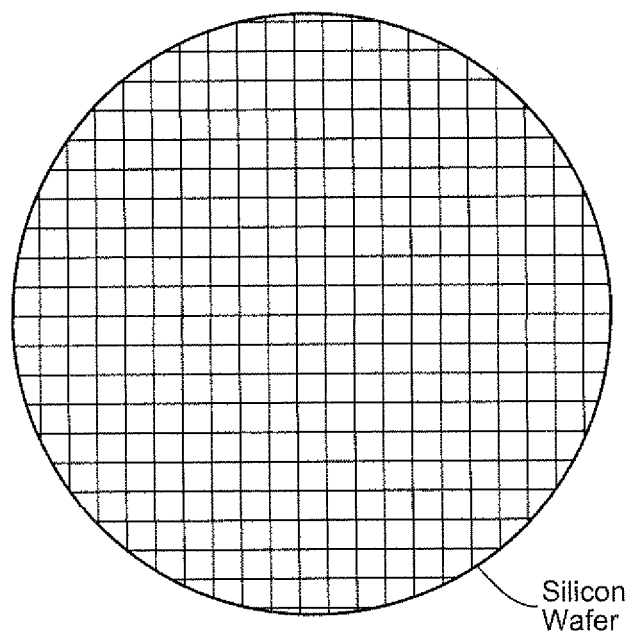
FIG. 3 illustrates an undivided Silicon wafer containing multiple memory controller dies according to the prior art.
Figure 4:
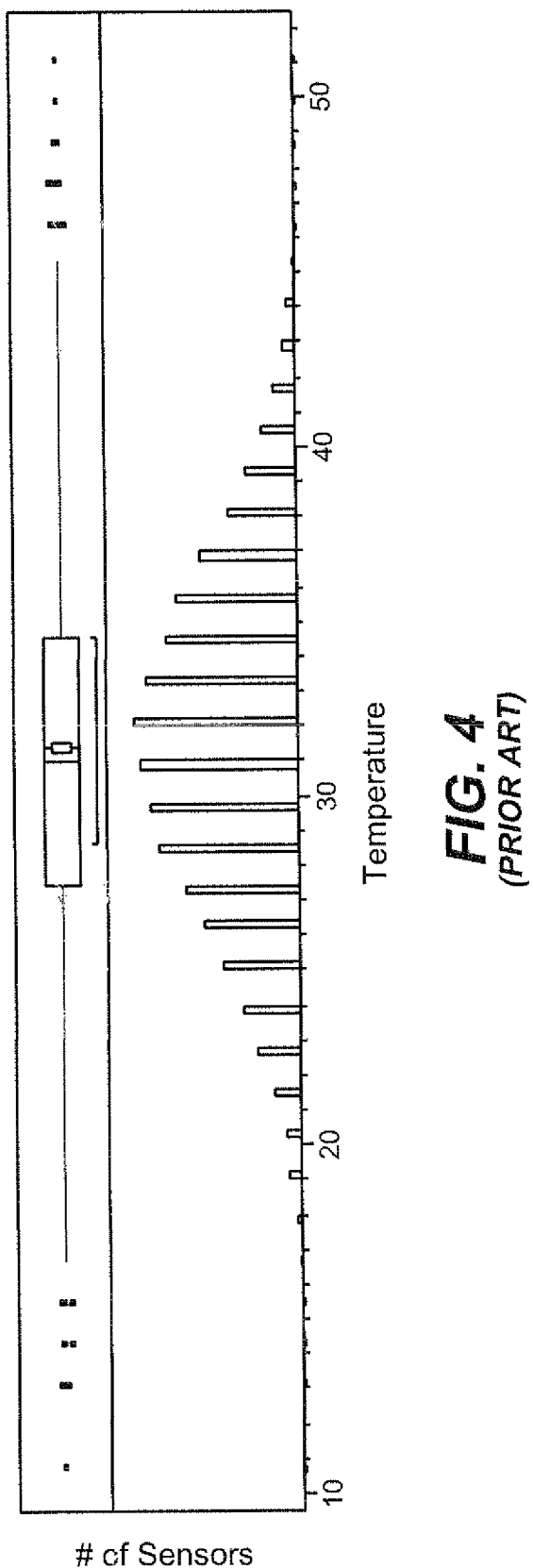
FIG. 4 illustrates the distribution of measured temperature for a number of memory controller temperature sensors at the same temperature according to the prior art.
Figure 5:
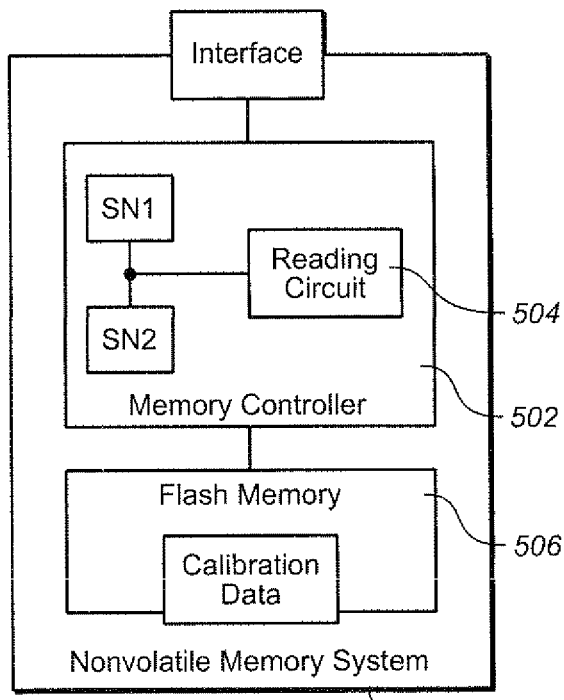
FIG. 5 illustrates a nonvolatile memory system that includes temperature sensing in a memory controller chip and temperature calibration data stored in a nonvolatile memory chip.

FIG. 5 illustrates schematically the main hardware components of a nonvolatile memory system 500 suitable for implementing aspects of the present invention. The memory system includes a memory controller chip 502 that has sense nodes (temperature sensors) SN1 and SN2, and a temperature reading circuit 504. However, the memory controller chip 502 does not have any e-fuses for storing temperature calibration information. In fact, the memory controller chip 502 may not have any e-fuses at all, thus providing a saving in space and process steps as compared with prior art memory controller chips. Instead of having e-fuses, the memory controller chip 502 is in communication with a nonvolatile memory chip, flash memory chip 506, in which temperature calibration data is stored. While storing the calibration data in the flash memory chip 506 has some cost because it occupies some space, this cost is minimal because the flash memory is designed for efficient bulk storage of data, and the space needed to store a small amount of calibration data may be provided at very little cost.

While the calibration data is shown as being in a particular area of flash memory chip 506, it will be understood that the calibration data does not have to be stored at a dedicated physical location but may be stored at different locations at different times according to a logical-to-physical mapping scheme. In some memory systems, a range of logical addresses is reserved for use by the memory controller. The temperature calibration data may be assigned to such a logical address and may be stored at whatever physical location is selected by the memory controller according to a logical-to-physical address assignment scheme. Alternatively, a fixed location may be used since the calibration data is not updated after the calibration is carried out and therefore should not need to be rewritten in the manner that host data is rewritten.

Figure 6B:
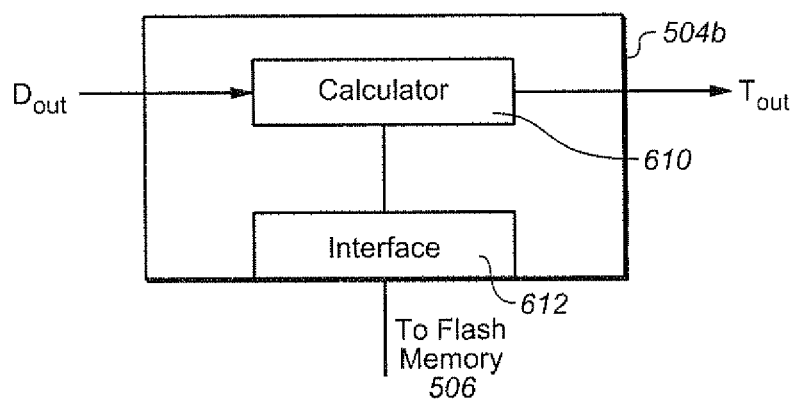
FIG. 6B illustrates some additional portions of temperature reading circuits.
Figure 6A:
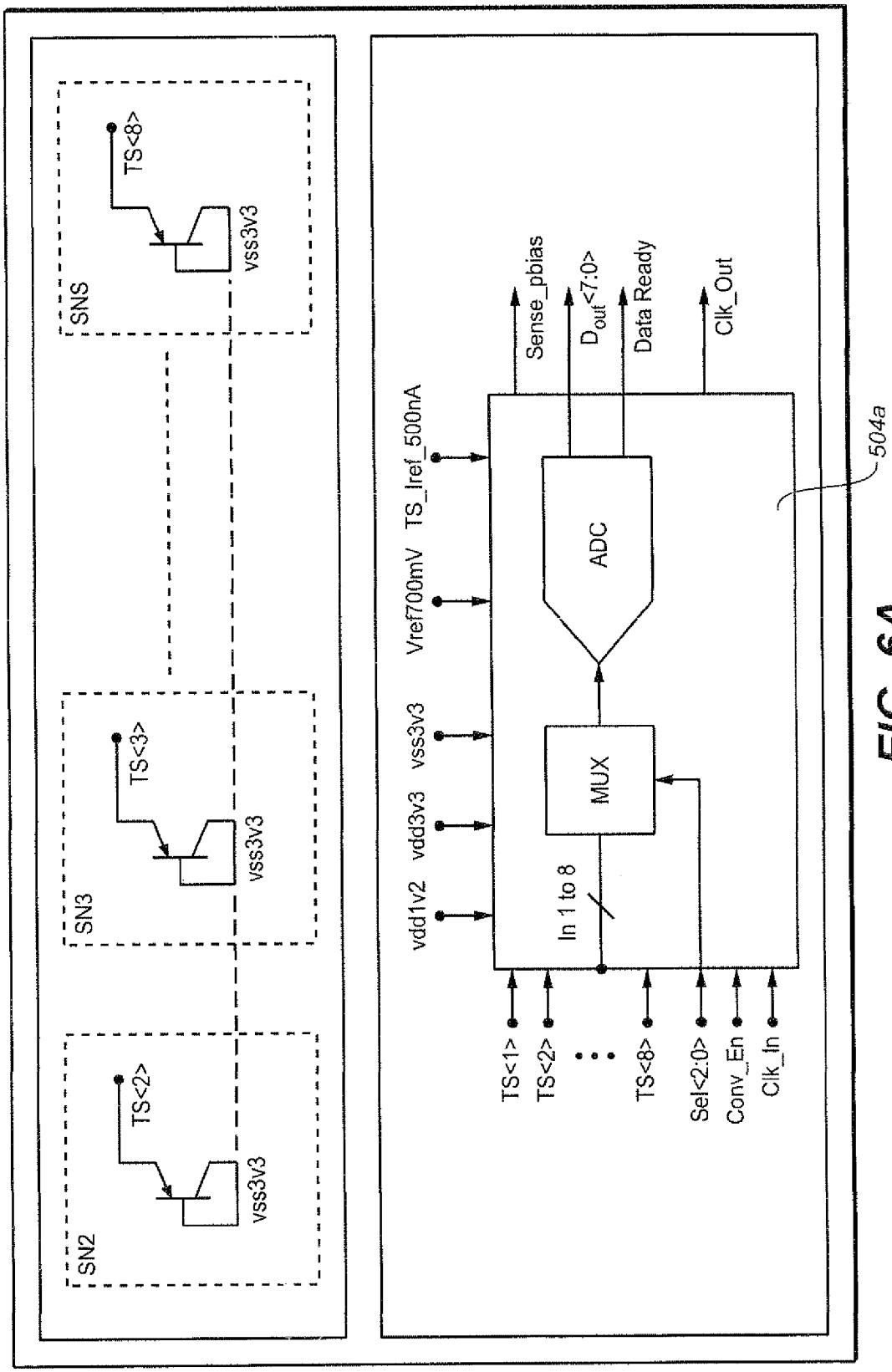
FIG. 6A illustrates temperature sensors and some portions of the temperature reading circuits of a memory controller chip.

FIG. 6A shows some of the temperature sensing and reading circuits 504a of the memory controller chip 502. FIG. 6A shows multiple temperature sensors, SN2-SN8 that are formed by connecting the base and the collector of PNP transistors to a supply voltage Vss3v3 (which may be ground) and monitoring the voltages at the emitter of the transistors. For example, sensor 2 (SN2) provides as its output Temperature Sense voltage TS<2> while sensor 3 (SN3) provides Temperature Sense voltage TS<3>. A memory controller chip may have any number of temperature sensors. A single temperature sensor may be sufficient in some cases, while in others it may be desirable to have many temperature sensors distributed about the memory controller chip. FIG. 6A shows an example of eight (8) temperature sensors but it will be understood that the present invention is not limited to a particular number of temperature sensors.

The outputs (emitter voltages) of the temperature sensors TS<1> to TS<8> are provided as analog inputs to a Multiplexer (MUX) that selects one of the inputs at a time and passes it to an Analog-to-Digital Converter (ADC). The digital output, Dout<7:0>, of the ADC is then provided as a digital value (TDET Code) that is indicative of the temperature at the sensor. However, further processing is required to obtain an accurate temperature reading from this digital value.

FIG. 6B shows an additional portion of the temperature reading circuit 504b that includes a calculator 610 which calculates an output temperature Tout from the digital signal Dout and from temperature calibration information that is obtained from a flash memory chip 506 through an interface 612. The interface 612 may communicate with the flash memory chip directly or through additional circuits that are part of the memory controller chip. In some cases, temperature calibration data that is received from the flash memory chip 506 is then stored locally in the memory controller chip 502, for example in a volatile RAM, so that it does not have to be requested from flash memory every time it is needed. It will be understood that the circuits shown here may be dedicated circuits in an ASIC. In other examples, some of the functions described may be performed by general purpose components according to firmware that is specifically written to carry out the function. For example, calculation of temperature Tout from Dout may not require a dedicated circuit but may be carried out by firmware operating in a general purpose processor.

Calibration

According to aspects of the present invention, the memory system described above, and similar memory systems, may be calibrated in an efficient manner that gives accurate temperature readings over a range of temperature.

Figure 7:
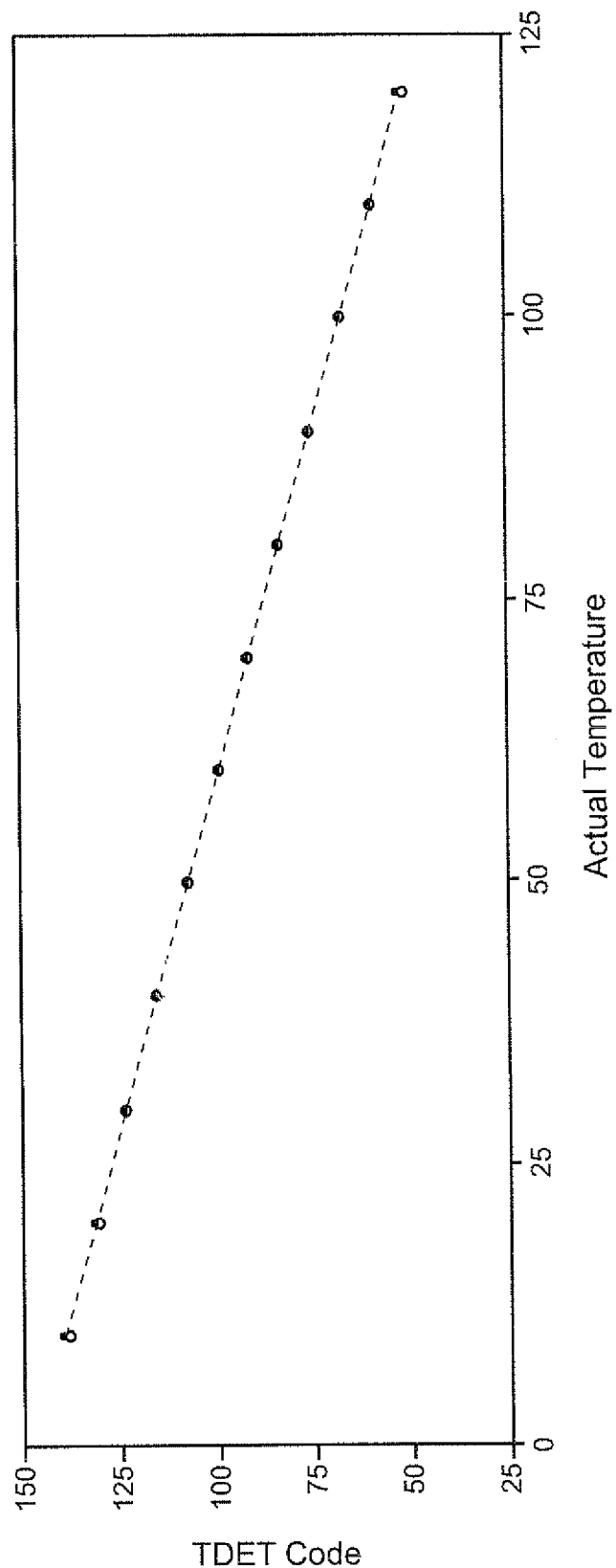
FIG. 7 illustrates temperature sensor output versus actual temperature for a single sensor.

FIG. 7 shows a graph of digital temperature sensor output (i.e. Dout, or TDET Code) as a function of actual temperature for a temperature sensor such as shown in FIG. 6A. Temperature sensor output was measured at twelve different temperatures and plotted as shown. This shows an approximately straight-line relationship between temperature sensor output and actual temperature. For the range of temperature over which the temperature sensor is expected to operate (approximately the range shown, 0-125 degrees centigrade) a straight line is a good enough approximation and any deviation from the straight-line relationship may be ignored.

Figure 8:
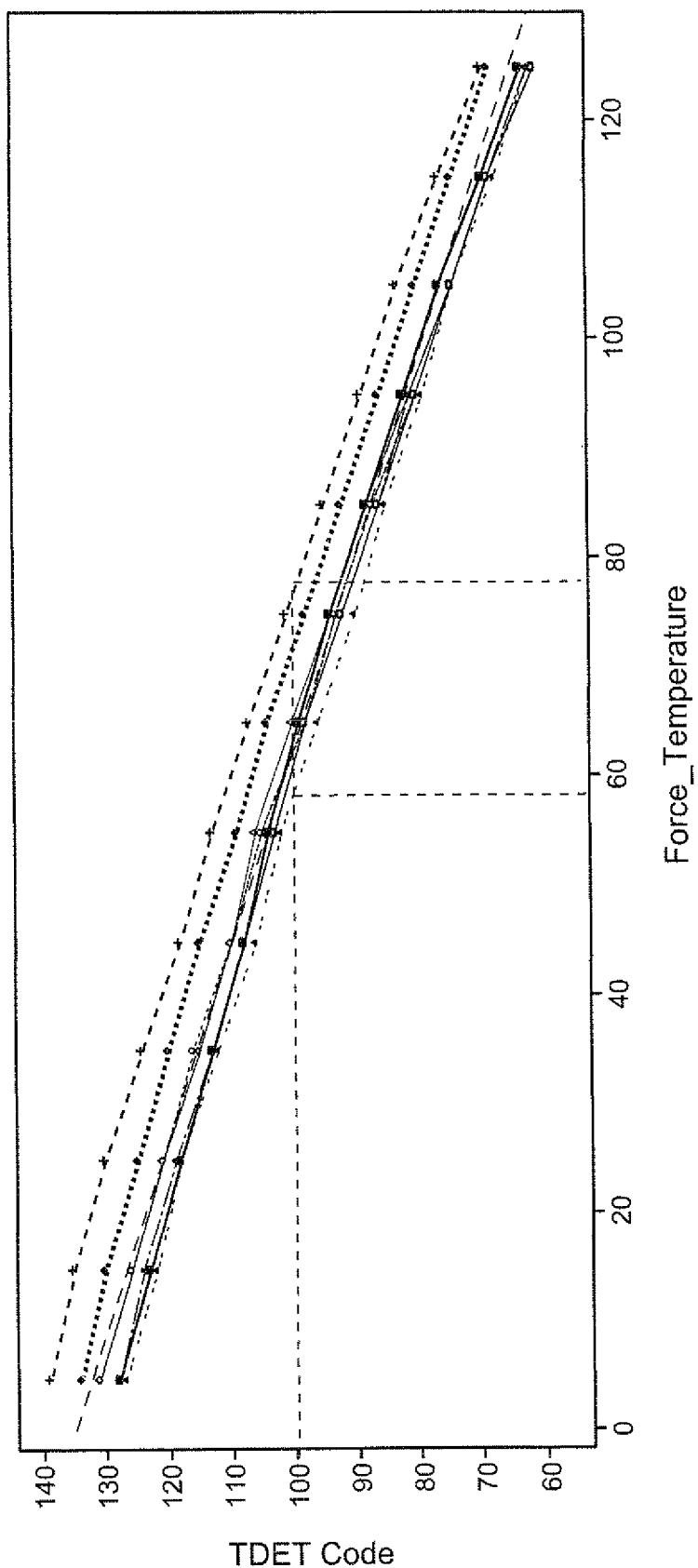
FIG. 8 illustrates temperature sensor output versus actual temperature for several sensors.

FIG. 8 is similar to FIG. 7 but in this case the outputs for several different temperature sensors are shown. It can be seen that for each sensor, the output has a straight-line relationship with the actual temperature as in FIG. 7. Furthermore, it can be seen that the slopes of the lines for the different temperature sensors are approximately the same. Differences in slopes over the range of interest are too small to be significant. Thus, it can be assumed that for any given temperature sensor of this kind, the relationship between the temperature sensor output and the actual temperature is a straight-line relationship with a slope that is a generic characteristic of all sensors of this kind.

It will be understood that the example here is just that, an example, and that other results may be obtained with different temperature sensors. For example, some temperature sensors may have a relationship between sensor output and actual temperature that is not a straight-line, but a curve, over the temperature range of interest. The curve of such a line may be generic to all such sensors. Other sensors may have straight-line relationships with a different slope. For a particular genus of temperature sensors, there are some generic characteristics that may be obtained for the genus, and which then do not have to be obtained for each individual die, or for each individual sensor. The genus of temperature sensors may be all temperature sensors in memory controllers made according to a particular design, in a particular production run, in a lot, or in some other group.

While the lines of FIG. 8 are all straight lines with approximately the same slope, these lines are not identical. Taking a digital output, for example 100, indicates that this may correspond to an actual temperature between about 58° C. and 78° C. In some cases, the variation from sensor-to-sensor may be even greater as previously discussed. It is generally desirable to obtain a more accurate temperature and this requires some individual calibration of a sensor.

Figure 9:
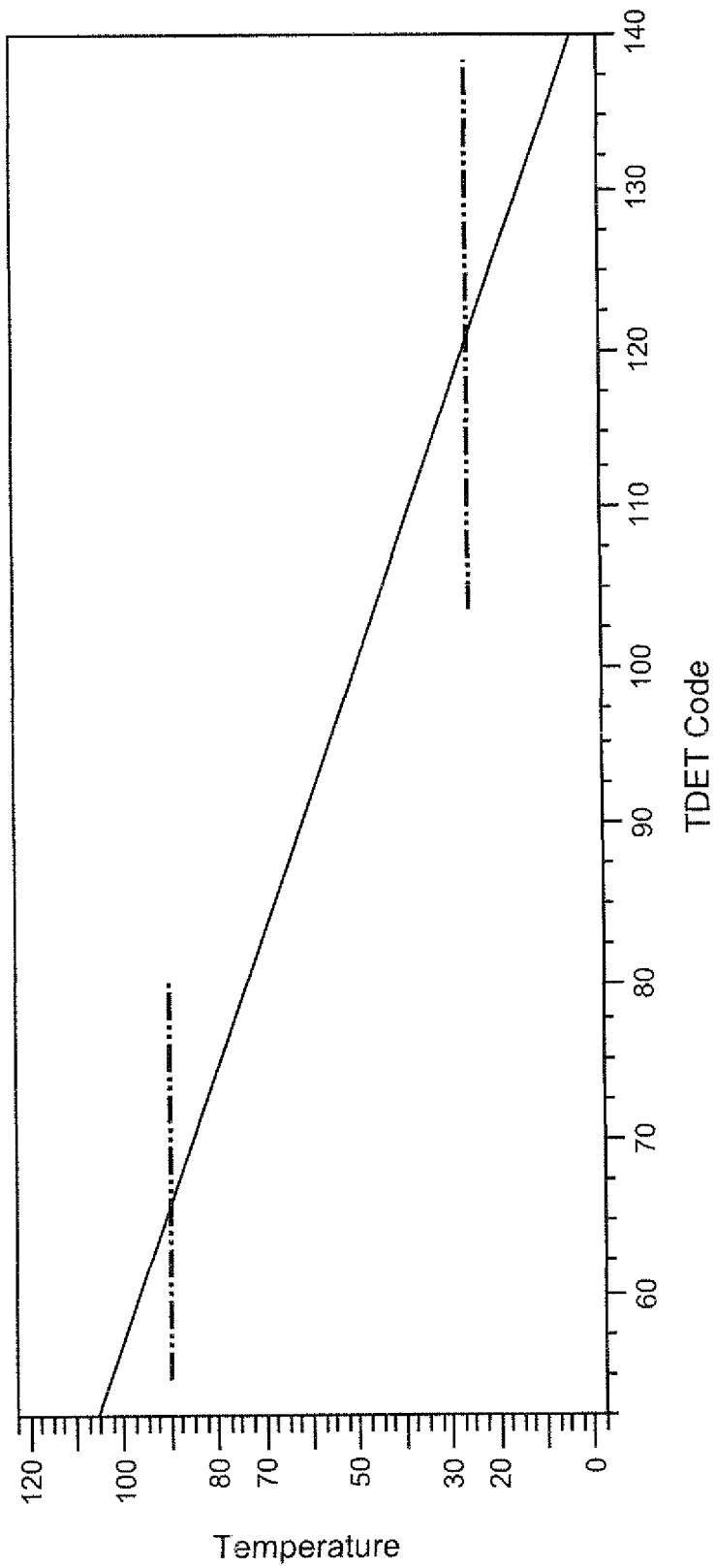
FIG. 9 shows a plot of averaged data for approximately 12,000 temperature sensors.

FIG. 9 shows a line that represents an average of approximately 12,000 temperature sensors that had their temperature sensor output measured at 25° C. (room temperature) and at 90° C. (Characterization was performed in the prior art manner, at wafer sort stage, using heating apparatus to heat up the Silicon wafer). The axes on this graph are swopped from previous graphs, with temperature on the y-axis and digital output (TDET code) on the x-axis. This line is used to provide generic characteristics of all sensors of this design. In particular, the slope of this line is assumed to be the same for all temperature sensors of this design and sensor-to-sensor differences are accounted for by means of an offset.

Figure 10:
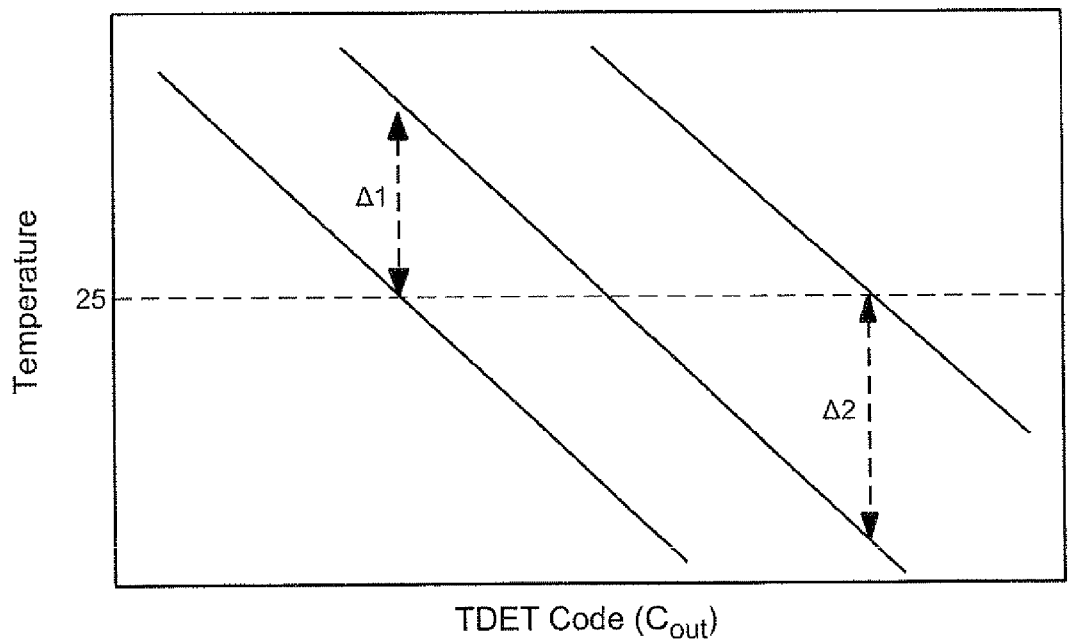
FIG. 10 shows offsets obtained by individual sensor calibration that are used to obtain a correct temperature reading from a sensor.

FIG. 10 shows how a single offset, obtained from room temperature measurement only, can be used to provide individual sensor calibration. Taking room temperature, 25° C., as an example, the dashed line shows three different digital outputs from three different temperature sensors at this temperature. The middle line shows ideal behavior, as shown in FIG. 9, and requires no offset. The lines on either side deviate from ideal behavior at room temperature, but a single offset Δ1 can bring the line on the left to ideal behavior, and offset Δ2 can bring the line on the right to ideal behavior. A simple offset is all that is needed because the slopes are the same for all temperature sensors.

It is well known that a straight-line relationship such as shown in FIGS. 9 and 10 can be represented by an equation of the sort:

$$T = a + b * C_{out} \qquad 1.$$

Where T is the temperature, Cout is the output code of the temperature sensor (TDET Code), and "a" and "b" are constants. From the data shown in FIG. 9, it is determined that a=168.1546 and b=−1.180571. Thus, the equation for the ideal sensor becomes (after rounding):

$$T = 168 - 1.18 * C\text{out} \qquad 2.$$

Actual sensors may deviate somewhat from this as shown in FIG. 10 because of the offset. The equation for such a sensor is:

$$T = a - 1.18 * C\text{out} \qquad 3.$$

Thus, the purpose of calibration can be thought of as finding the value of "a" for a given sensor. This may be done at room temperature where the equation has the following values:

$$25 = a - 1.18 * C_{out@25} \qquad 4.$$

(Where $C_{out@25}$ is the TDET Code at 25 degrees centigrade.) From this, the value of "a" can be written as:

$$a = 25 - 1.18 * C_{out@25} - 143 \qquad 5.$$

Putting this value of "a" back into the original equation gives:

$$T = 25 - 1.18 * (C\text{out} - C_{out@25}) \qquad 6.$$

Thus, the output of the temperature sensor at room temperature ($C_{out@25}$) is the only sensor-specific information that is needed to calibrate the temperature sensor. Either the value of "a" or $C_{out@25}$, or some other value derived from $C_{out@25}$ may be stored as an offset.

Figure 11:
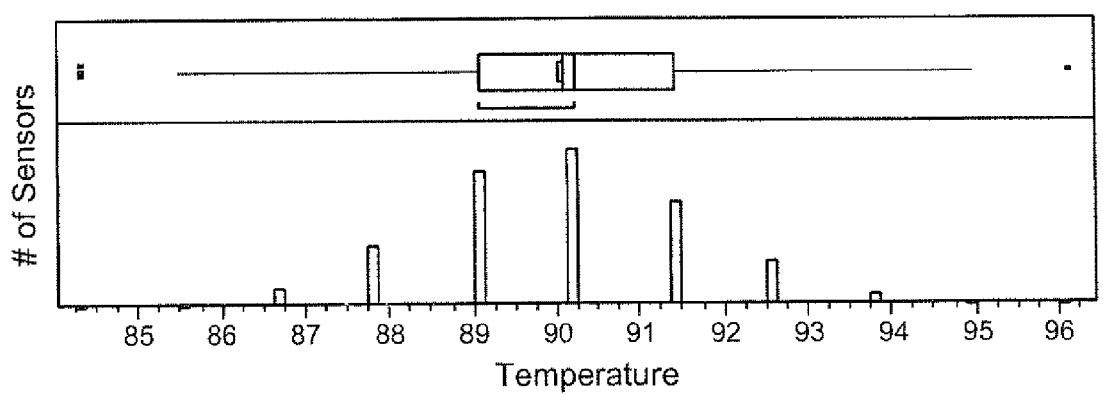
FIG. 11 illustrates the distribution of temperature readings at 90 degrees centigrade from temperature sensors that were calibrated only at room temperature.

FIG. 11 shows the results of calibration using this technique over approximately 12,000 memory controllers. It can be seen that, even though calibration was performed only at room temperature, 25° C., the variation between corrected temperatures at approximately 90° C. is small, with most corrected temperatures being within about 2° C. of the correct temperature. This level of accuracy is generally sufficient for the purposes of detecting dangerously high temperatures in memory controllers.

Figure 12:
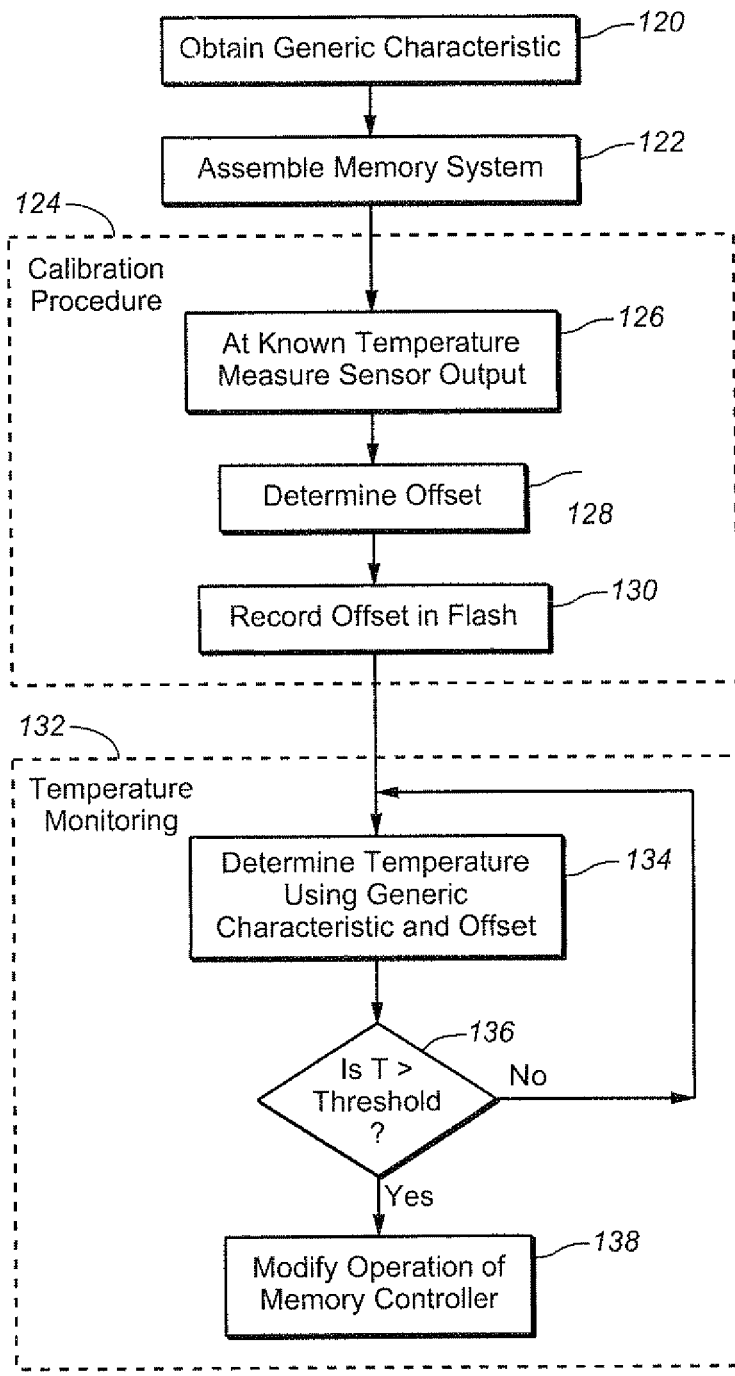
FIG. 12 is a flowchart of a calibration process and a temperature monitoring process for a temperature sensor.

FIG. 12 shows a portion of a manufacturing process for a memory system that includes a calibration procedure, and also shows later temperature monitoring that uses the result of the calibration procedure. In a first step, a generic characteristic of temperature sensors is obtained 120. Subsequently, a memory system is assembled 122 that includes temperature sensors with the generic characteristic. This generally includes connecting a memory controller chip and at least one nonvolatile memory chip such as a flash memory chip. The memory controller chip is also connected to an interface so that it can communicate with a host. Once assembled, the memory system is capable of operation. That is, data can be written in the nonvolatile memory chip by the memory controller.

Next, a calibration procedure 124 is performed. First, a temperature sensor output is measured at a known temperature 126. In general this is done at room temperature so that no specialized heating or cooling equipment is needed. This step may be performed by the memory controller in response to a command received through the interface.

Next, an offset is determined 128. In some cases, as described above, the temperature sensor output at room temperature $C_{out@25}$ is stored and used as an offset. In other cases, some number may be derived from the output at room temperature and stored as an offset. In either case, the results of the measuring at room temperature are stored in the nonvolatile memory chip. The calibration is completed at this point (without modifying the temperature of the memory system from room temperature).

The results of the calibration procedure, in this case a simple offset, may subsequently be used for temperature monitoring 132. This may be done using equation 6 above. Typically, calibration is performed at the factory before the memory system is shipped to an end user. Subsequently, temperature is monitored when the memory system is in use. This may begin immediately after calibration, for example during testing or burn-in, where it can identify defective memory systems. In general, temperature monitoring is performed throughout the operational life of the product to protect the product when it is in use. Temperature may be continuously monitored, or may be monitored periodically, or may be monitored at discrete times in response to predetermined criteria.

In general, temperature measurement is performed to avoid heating of the memory controller chip to a temperature that could cause damage to the memory controller chip or could impair the function of the memory controller chip (for example by causing errors in read data or affecting timing parameters). The temperature is determined using the generic characteristic and the offset from calibration procedure 134. The measured temperature may be compared with a threshold temperature 136 to determine if the memory chip is approaching a temperature at which some impairment or damage is likely to occur. If the measured temperature exceeds the threshold temperature, indicating that the memory controller chip is approaching a dangerous temperature, then the memory controller may modify its operation 138 so that less heat is produced. The memory controller may stop performing certain operations that are not critical (e.g. garbage collection) or may slow down certain operations, for example by reducing clock speed. In some cases, the measured temperature may be compared with multiple threshold voltages and different actions may be taken when the temperature exceeds different thresholds. For example, non-essential operations may be stopped at a first temperature, speed of essential operations (e.g. read, and write in response to host commands) may be slowed down at a second temperature, and even essential operations may be stopped at a third temperature (and an error returned to the host) so that damage to the memory controller chip is prevented.

Conclusion

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of calibrating a temperature sensor in a memory controller chip, in a multi-chip memory system, comprising:
    assembling the multi-chip memory system, including connecting the memory controller chip to at least one nonvolatile memory chip;
    subsequently, measuring an output of the temperature sensor at a first temperature and storing a result of the measuring in the nonvolatile memory chip;
    subsequently, measuring an output of the temperature sensor at a second temperature that is different to the first temperature; and
    calculating the second temperature from:
    (a) the output of the temperature sensor at the second temperature;
    (b) the stored result of the measuring at the first temperature; and (c) a relationship between temperature and sensor output over a temperature range of interest of temperature sensors of a genus that includes the temperature sensor.

2. The method of claim 1 wherein the multi-chip memory system is embodied in a flash memory card, solid-state drive, or USB drive.

3. The method of claim 1 wherein the multi-chip memory system is embodied in an embedded memory system.

4. The method of claim 1 wherein the nonvolatile memory chip is a flash memory chip.

5. The method of claim 1 wherein the relationship is a slope of a straight-line relationship between temperature and sensor output over the temperature range of interest.

6. The method of claim 5 wherein the slope is obtained prior to the assembling of the multi-chip memory system.

7. The method of claim 1 wherein no temperature calibration is performed for the temperature sensor prior to the assembling.

8. The method of claim 1 wherein the measuring the output of the temperature sensor at the first temperature and storing the result of the measuring are performed in a factory prior to sale to an end user.

9. The method of claim 1 wherein the measuring the output of the temperature sensor at the first temperature provides temperature calibration for the memory controller chip without any other measuring of the output of the temperature sensor at another temperature.

10. A multi-chip nonvolatile memory system comprising:
a nonvolatile memory chip that contains a plurality of nonvolatile memory cells;
a memory controller chip that is connected to the nonvolatile memory chip;
a temperature sensor, in the memory controller chip, providing an output that is dependent on temperature; and
a temperature reading circuit connected to the output of the temperature sensor, in the memory controller chip, the temperature reading circuit calculating a temperature measurement from the output of the temperature sensor according to an offset that is stored in the nonvolatile memory chip, the offset derived from the output of the temperature sensor at a calibration temperature during calibration of the multi-chip nonvolatile memory system, and from a relationship between temperature and sensor output over a temperature range of interest of temperature sensors of a genus that includes the temperature sensor.

11. The multi-chip nonvolatile memory system of claim 10 wherein there are no e-fuses in the memory controller chip.

12. The multi-chip nonvolatile memory system of claim 10 further comprising a physical interface for connecting to a host system.

13. The multi-chip nonvolatile memory system of claim 12 wherein the physical interface is a USB interface, or memory card interface.

14. The multi-chip nonvolatile memory system of claim 12 wherein the physical interface is a Ball Grid Array (BGA) interface.

15. A method of providing on-chip calibrated temperature measurement for a temperature sensor in a memory controller chip of a multi-chip flash memory system, comprising:
obtaining a relationship between temperature and sensor output over a temperature range of interest of temperature sensors of a genus that includes the temperature sensor;
assembling the multi-chip flash memory system, including connecting the memory controller chip to a flash memory chip;
subsequently, measuring an output of the temperature sensor at a first temperature and storing a result of the measuring in the flash memory chip;
subsequently, measuring an output of the temperature sensor at a second temperature that is different to the first temperature;
calculating the second temperature from:
(d) the output of the temperature sensor at the second temperature;
(e) the stored result of the measuring at the first temperature; and
(f) the relationship between temperature and sensor output over the temperature range of interest of temperature sensors of the genus that includes the temperature sensor;
comparing the second temperature with a threshold temperature; and
modifying the operation of the memory controller chip if the second temperature is greater than the threshold temperature.

16. The method of claim 15 wherein the threshold temperature is a temperature above which continued operation of the memory controller chip is likely to cause impairment of memory controller chip functions, or damage to the memory controller chip, and wherein the modifying the operation of the memory controller chip includes modification that reduces heat generation in the memory controller chip.

* * * * *